(12) United States Patent
Nomura et al.

(10) Patent No.: US 6,956,884 B1
(45) Date of Patent: Oct. 18, 2005

(54) SEMICONDUCTOR LIGHT EMITTING DEVICE

(75) Inventors: Yasuhiko Nomura, Moriguchi (JP); Nobuhiko Hayashi, Osaka (JP); Masayuki Shono, Hirakata (JP)

(73) Assignee: Sanyo Electric Co., Ltd., Moriguchi (JP)

(*) Notice: Subject to any disclaimer, the term of this patent is extended or adjusted under 35 U.S.C. 154(b) by 0 days.

(21) Appl. No.: 09/665,911

(22) Filed: Sep. 20, 2000

(30) Foreign Application Priority Data

Sep. 24, 1999 (JP) .................................. 11-271127

(51) Int. Cl.⁷ .............................................. H01S 5/22
(52) U.S. Cl. ........................ 372/46; 372/44; 372/45; 257/86; 257/94; 257/102; 257/103
(58) Field of Search .................. 372/50, 43–46; 257/102, 103, 13, 79, 86, 94

(56) References Cited

U.S. PATENT DOCUMENTS

| | | | | |
|---|---|---|---|---|
| 4,888,624 A | * | 12/1989 | Johnston et al. | 257/609 |
| 5,932,896 A | | 8/1999 | Sugiura et al. | 257/94 |
| 5,963,572 A | * | 10/1999 | Hiroyama et al. | 372/45 |
| 5,966,396 A | * | 10/1999 | Okazaki et al. | 372/45 |
| 5,966,397 A | * | 10/1999 | Hirata | 372/43 |
| 5,974,068 A | * | 10/1999 | Adachi et al. | 372/45 |
| 5,998,810 A | * | 12/1999 | Hatano et al. | 257/102 |
| 6,064,079 A | | 5/2000 | Yamamoto et al. | 257/101 |
| 6,111,273 A | * | 8/2000 | Kawai | 257/102 |
| 6,215,803 B1 | * | 4/2001 | Hata | 372/46 |

FOREIGN PATENT DOCUMENTS

| | | | |
|---|---|---|---|
| JP | 07-045902 | 2/1995 | |
| JP | 09-246651 | 9/1997 | |
| JP | 09246651 | 9/1997 | |
| JP | 09-270569 | 10/1997 | |
| JP | 10-93198 | 4/1998 | |
| JP | 10093198 | 4/1998 | |
| JP | 10-150240 | 6/1998 | |
| JP | 10303502 | 11/1998 | |
| JP | 10-321962 | 12/1998 | |
| JP | 10321962 A | * 12/1998 | ........... H01L 33/00 |
| JP | 11031866 | 2/1999 | |
| JP | 11-204882 | 7/1999 | |
| JP | 11214800 | 8/1999 | |

OTHER PUBLICATIONS

European Patent Office Communication, dated Dec. 23, 2002 in correspondence to the European Patent Application 00308270.8-2203.
Office Action of Apr. 22, 2003 for the corresponding Japanese application.
European Search Report dated Feb. 6, 2004.

* cited by examiner

*Primary Examiner*—Tom Thomas
*Assistant Examiner*—Matthew Landau
(74) *Attorney, Agent, or Firm*—Westerman, Hattori, Daniels & Adrian, LLP

(57) ABSTRACT

A second cladding layer composed of p-AlGaN and a second contact layer composed of p-GaN are formed in this order on a light emitting layer composed of a nitride based semiconductor. A predetermined region of the second cladding layer and the second contact layer is removed, to form a ridge portion. A high-resistive current blocking layer, to which impurities have been added, is formed on an upper surface of a flat portion of the second cladding layer, which remains without being removed, and on both sidewalls of the ridge portion.

7 Claims, 13 Drawing Sheets

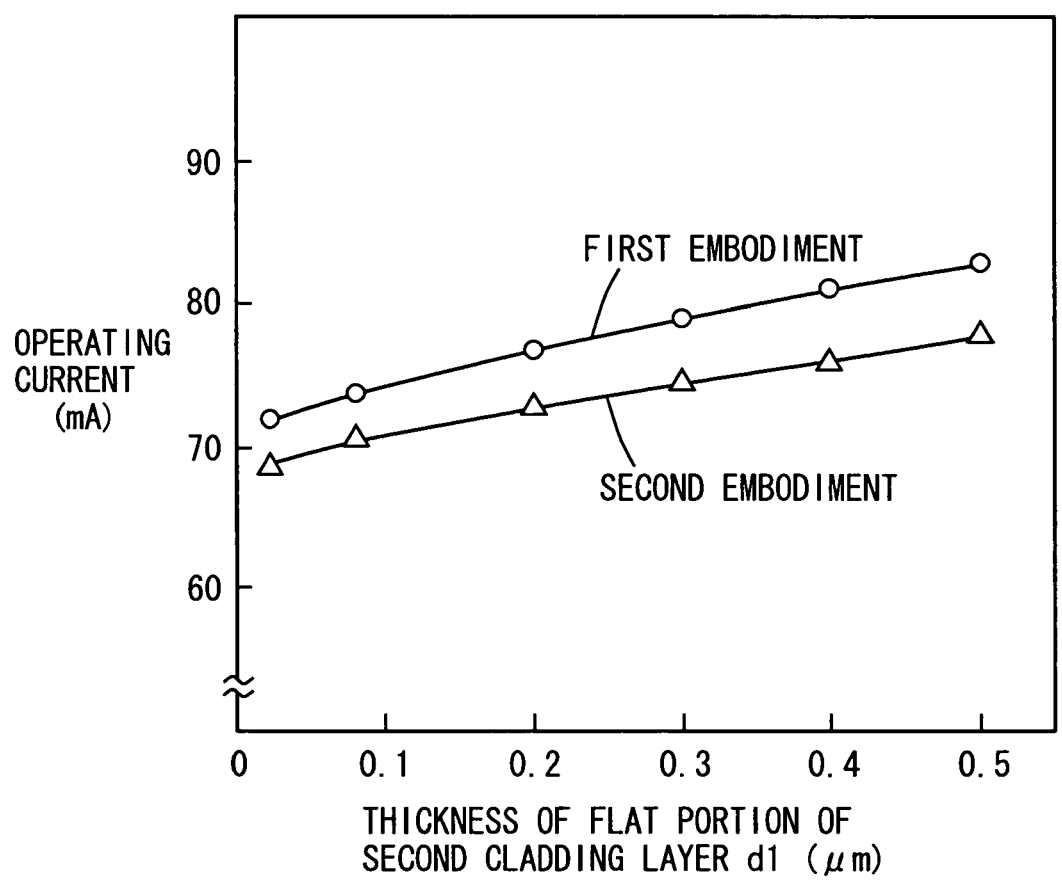
F I G. 1 6

SEMICONDUCTOR LIGHT EMITTING DEVICE

BACKGROUND OF THE INVENTION

1. Field of the Invention

The present invention relates to a semiconductor light emitting device composed of BN (boron nitride), GaN (gallium nitride), AlN (aluminum nitride), InN (indium nitride) or TlN (thallium nitride) or an III-V group nitride based semiconductor (hereinafter referred to as a nitride based semiconductor) which is their mixed crystal.

2. Description of the Background Art

In recent years, nitride based semiconductor laser devices which emit light in blue or violet have been studied and developed as light sources for recording or reproduction used for high-density and large-capacity optical disk systems. In the high-density and large-capacity optical disk systems, an improvement in recording and reproducing speed is required with an increase in capacity. For achievement of it, it is necessary for nitride based semiconductor laser devices as light sources to operate at high frequency.

FIG. 17 is a cross-sectional view showing the structure of a conventional semiconductor laser device described in JP-A-10-321962.

The semiconductor laser device shown in FIG. 17 is obtained by forming, on an n-SiC substrate 21, an n-buffer layer 22 composed of GaN, an n-cladding layer 23 composed of $Al_{0.1}Ga_{0.9}N$, an active layer 24 composed of undoped $In_{0.32}Ga_{0.68}N$, and a p-cladding layer 25 composed of Mg doped $Al_{0.1}Ga_{0.9}N$ in this order.

A ridge portion is formed in the p-cladding layer 25. An n-surface evaporation protective layer 26 composed of $Al_{0.5}Ga_{0.95}N$ is formed on a flat portion of the p-cladding layer 25 and on sidewalls of the ridge portion. An Mg highly doped $Al_{0.5}Ga_{0.95}N$ layer 20 is further formed on an upper surface of the ridge portion. An n-current blocking layer 27 composed of $Al_{0.15}Ga_{0.85}N$ is formed on the n-surface evaporation protective layer 26. A p-contact layer 28 composed of Mg doped GaN is formed on the n-current blocking layer 27 and the Mg highly doped $Al_{0.05}Ga_{0.95}N$ layer 20. A p-side electrode 29 is formed on the p-contact layer 28, and an n-side electrode 30 is formed on the reverse surface of the n-SiC substrate 21.

As shown in FIG. 17, in the conventional semiconductor laser device having the n-current blocking layer 27 on both sides of the ridge portion and the flat portion of the p-cladding layer 25, when the pulse width is shortened under pulsed operation, response characteristics of the rise time and the fall time of light output power are degraded.

SUMMARY OF THE INVENTION

An object of the present invention is to provide a semiconductor light emitting device in which response characteristics under pulsed operation with a small pulse width are improved.

A semiconductor light emitting device according to an aspect of the present invention comprises an active layer composed of a nitride based semiconductor; a cladding layer formed on the active layer, composed of a nitride based semiconductor of a first conductivity type, and having a flat portion and a ridge portion formed on the flat portion; and a first current blocking layer formed on the flat portion and on sidewalls of the ridge portion of the cladding layer and composed of a high-resistive nitride based semiconductor containing impurities.

Examples of a method of containing impurities in the first current blocking layer include a doping method and an ion implantation method.

In the semiconductor light emitting device, the first current blocking layer is not of a conductivity type opposite to that of the cladding layer by doping impurities but is high resistive. Therefore, parasitic capacitance in the vicinity of the interface of the first current blocking layer and the cladding layer can be reduced, thereby making it possible to realize a semiconductor light emitting device in which response characteristics under pulsed operation with a small pulse width are improved.

It is preferable that the impurities contain at least one of zinc, beryllium, calcium, and carbon. By adding the impurities, the nitride based semiconductor is easily made high resistive, thereby making it possible to improve the response characteristics under pulsed operation with a small pulse width.

It is preferable that the first current blocking layer has a resistance value of not less than 1.5 Ω·cm. In this case, the response characteristics under pulsed operation with a small pulse width are sufficiently improved.

It is preferable that the semiconductor light emitting device further comprises a second current blocking layer formed on the first current blocking layer and composed of a nitride based semiconductor of a second conductivity type opposite to the first conductivity type. In this case, an operating current in the semiconductor light emitting device can be reduced, as compared with that in a case where no second current blocking layer is formed.

The thickness of the first current blocking layer is preferably not less than 0.5 μm, and more preferably not less than 1.0 μm.

The thickness of the flat portion of the cladding layer is preferably not more than 0.3 Um, and more preferably not more than 0.08 μm.

The nitride based semiconductor may contain at least one of boron, gallium, aluminum, indium, and thallium.

A semiconductor light emitting device according to another aspect of the present invention comprises an active layer composed of a nitride based semiconductor; a cladding layer formed on the active layer, composed of a nitride based semiconductor of a first conductivity type, and having a flat portion and a ridge portion formed on the flat portion, the cladding layer having a recess on the flat portion along both sidewalls of the ridge portion; and a first current blocking layer formed on the flat portion and on the sidewalls of the ridge portion such that it is embedded in the recess of the cladding layer.

In the semiconductor light emitting device, the first current blocking layer is formed in the recess along both the sidewalls of the ridge portion of the cladding layer. Consequently, parasitic capacitance in the vicinity of the first current blocking layer in the recess is reduced, thereby improving response characteristics under pulsed operation with a small pulse width in the semiconductor light emitting device.

It is preferable that the first current blocking layer is composed of a high-resistive nitride based semiconductor containing impurities. In this case, the parasitic capacitance in the vicinity of the interface of the first current blocking layer and the cladding layer can be reduced, thereby making it possible to further improve the response characteristics under pulsed operation with a small pulse width in the semiconductor light emitting device.

Examples of a method of containing impurities in the first current blocking layer include a doping method and an ion implantation method.

It is preferable that the impurities contain at least one of zinc, beryllium, calcium, and carbon. By adding the impurities, the nitride based semiconductor is easily made high resistive, thereby making it possible to improve the response characteristics under pulsed operation with a small pulse width in the semiconductor light emitting device.

It is preferable that the first current blocking layer has a resistance value of not less than 1.5 Ω·cm. In this case, the response characteristics under pulsed operation with a small pulse width in the semiconductor light emitting device are sufficiently improved.

It is preferable that the semiconductor light emitting device further comprises a second current blocking layer formed on the first current blocking layer and composed of a nitride based semiconductor of a second conductivity type opposite to the first conductivity type. In this case, it is possible to reduce an operating current in the semiconductor light emitting device.

The thickness of the first current blocking layer is preferably not less than 0.5 $\mu$m, and more preferably not less than 1.0 $\mu$m.

The thickness of the flat portion of the cladding layer is preferably not more than 0.3 $\mu$m, and more preferably not more than 0.08 $\mu$m.

The nitride based semiconductor may contain at least one of boron, gallium, aluminum, indium, and thallium.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 16 is a diagram showing the results of measurement of dependence of an operating current on the thickness of the flat portion of the second cladding layer in each of the semiconductor laser devices in the first and second embodiments.

DESCRIPTION OF THE PREFERRED EMBODIMENTS

First Embodiment

Figure 1:
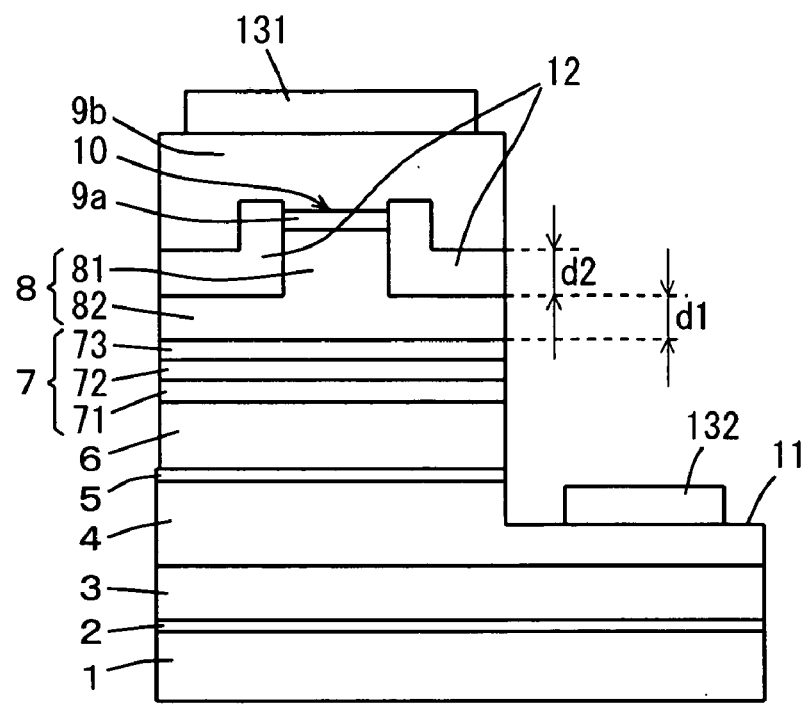
FIG. 1 is a schematic cross-sectional view showing the structure of a semiconductor laser device according to a first embodiment of the present invention.

FIG. 1 is a schematic cross-sectional view showing the structure of a nitride based semiconductor laser device according to a first embodiment of the present invention. The semiconductor laser device according to the first embodiment is a ridge wave-guided semiconductor laser device.

In the semiconductor laser device shown in FIG. 1, a buffer layer 2 having a thickness of 25 nm composed of undoped $Al_{0.5}Ga_{0.5}N$, an undoped GaN layer 3 having a thickness of 2 $\mu$m composed of undoped GaN, a first contact layer 4 having a thickness of 3 $\mu$m composed of Si doped n-GaN, a crack preventing layer 5 having a thickness of 0.1 $\mu$m composed of Si doped $n-In_{0.1}Ga_{0.9}N$, a first cladding layer 6 having a thickness of 1.5 $\mu$m composed of Si doped $n-Al_{0.7}Ga_{0.93}N$, alight emitting layer 7 having a multiquantum well structure, described later, a second cladding layer 8 having a thickness of 1.5 $\mu$m composed of Mg doped $p-Al_{0.7}Ga_{0.93}N$, and a second contact layer 9a having a thickness of 0.05 $\mu$m composed of Mg doped p-GaN are stacked in this order on a C plane of a sapphire substrate 1 by MOCVD (Metal Organic Chemical Vapor Deposition).

Both sides of a striped region of the second contact layer 9a and the second cladding layer 8 are removed by reactive ion etching (RIE) or reactive ion beam etching (RIBE), leaving a portion having a predetermined thickness d1, to form a striped ridge portion 10. The width of the ridge portion 10 at this time is adjusted between 2.0 to 5.0 $\mu$m. The second cladding layer 8 has a flat portion 82 having a thickness of d1 and a projection 81.

A partial region from the second contact layer 9a to the first contact layer 4 is etched away to a predetermined depth, to form an electrode forming surface 11 on the first contact layer 4.

A current blocking layer 12 having a thickness of d2 composed of $Al_{0.12}Ga_{0.88}N$ is formed on both sidewalls of the ridge portion 10 and on the flat portion 82 of the second cladding layer 8. Further, a third contact layer 9b having a thickness of 0.5 μm composed of Mg doped p-GaN is stacked from an upper surface of the second contact layer 9a to an upper surface of the current blocking layer 12.

A p-side electrode 131 is formed on the third contact layer 9b, and an n-side electrode 132 is formed on the electrode forming surface 11 of the first contact layer 4.

Figure 2:
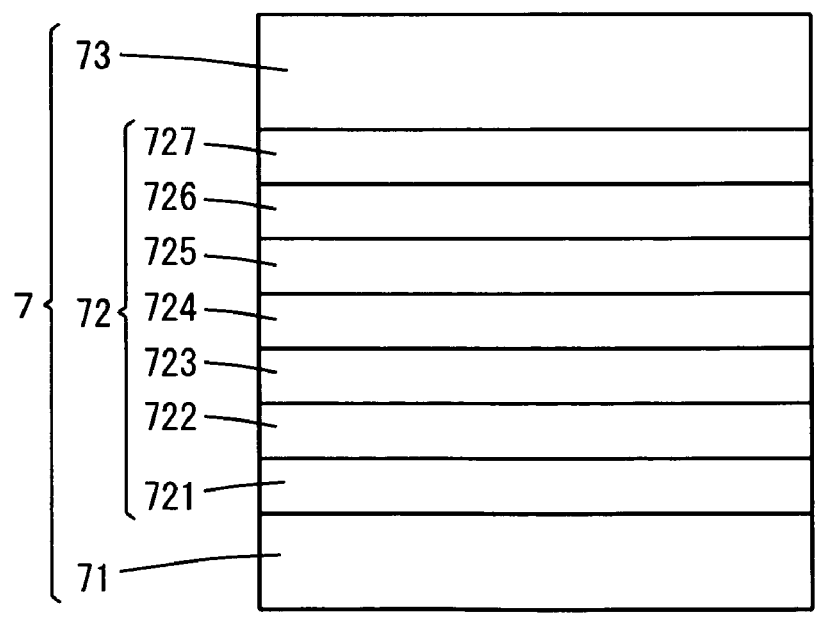
FIG. 2 is a schematic cross-sectional view showing the structure of an active layer in the semiconductor laser device shown in FIG. 1.

FIG. 2 is a cross-sectional view showing the structure of the light emitting layer 7. The light emitting layer 7 comprises a first optical guide layer 71 having a thickness of 0.1 μm composed of Si doped n-GaN formed on the first cladding layer 6, an active layer 72 formed thereon, and a second optical guide layer 73 having a thickness of 0.1 μm composed of Mg doped p-GaN formed thereon. The active layer 72 has a multiquantum well structure obtained by alternately stacking barrier layers 721, 723, 725, and 727 having a thickness of 6 nm composed of Si doped n-$In_{0.02}Ga_{0.98}N$ and well layers 722, 724, and 726 having a thickness of 3 nm composed of Si doped n-$In_{0.10}Ga_{0.90}N$.

The current blocking layer 12 composed of $Al_{0.12}Ga_{0.88}N$ is made high resistive by doping impurities. Used as the impurities are at least one of zinc, beryllium, calcium, and carbon.

In the semiconductor laser device according to the present invention, the current blocking layer 12 composed of $Al_{0.12}Ga_{0.88}N$ is made high resistive by doping the impurities, so that parasitic capacitance in the interface of the current blocking layer 12 and the flat portion 82 of the second cladding layer 8 is reduced. Consequently, the rise time tr of light output power is shortened under pulsed operation. From the same reasons, the fall time of light output power is shortened under pulsed operation. Consequently, response characteristics of light output power in the semiconductor laser device shown in FIG. 1 are improved.

It is preferable that the resistance value of the current blocking layer 12 is not less than 1.5 Ω·cm in order to sufficiently improve the response characteristics of light output power.

Second Embodiment

Figure 3:
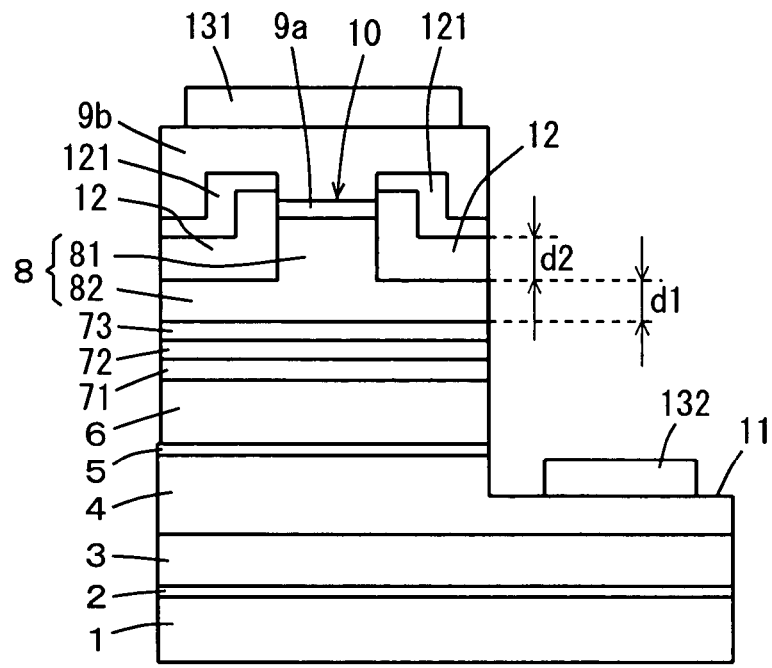
FIG. 3 is a schematic cross-sectional view showing the structure of a semiconductor laser device according to a second embodiment of the present invention.

FIG. 3 is a schematic cross-sectional view showing the structure of a semiconductor laser device according to a second embodiment of the present invention.

The semiconductor laser device shown in FIG. 3 and the semiconductor laser device shown in FIG. 1 differ in the structure of a current blocking layer. Portions excluding a second current blocking layer 121 in the semiconductor laser device shown in FIG. 3 have the same structures as those in the semiconductor laser device shown in FIG. 1. In the semiconductor laser device shown in FIG. 3, a second current blocking layer 121 having a thickness of 0.3 μm composed of n-$Al_{0.12}Ga_{0.88}N$ is formed on the current blocking layer 12 in the semiconductor laser device shown in FIG. 1. An example of an n-type dopant is Si.

In the semiconductor laser device according to the present embodiment, the current blocking layer 12 composed of $Al_{0.12}Ga_{0.88}N$ is made high resistive by doping impurities, so that response characteristics of light output power are improved, as in the semiconductor laser device shown in FIG. 1. Further, the second current blocking layer 121 of a conductivity type opposite to that of the second cladding layer 8 is provided, thereby reducing an operating current.

Third Embodiment

Figure 4:
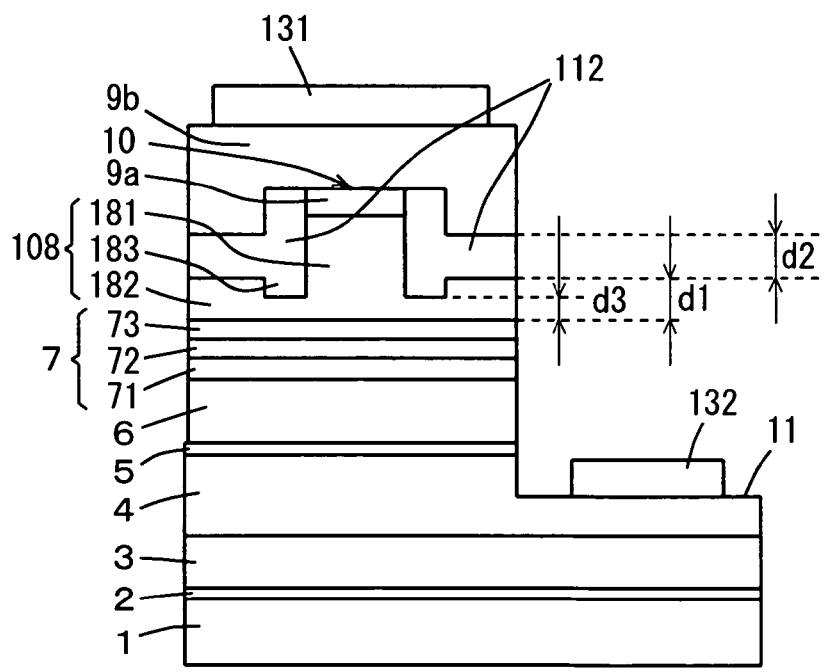
FIG. 4 is a schematic cross-sectional view showing the structure of a semiconductor laser device according to a third embodiment of the present invention.

FIG. 4 is a schematic cross-sectional view showing the structure of a semiconductor laser device according to a third embodiment of the present invention.

The semiconductor laser device shown in FIG. 4 and the semiconductor laser device shown in FIG. 1 differ in a second cladding layer and a current blocking layer. Portions excluding a second cladding layer 108 and a current blocking layer 112 in the semiconductor laser device shown in FIG. 4 have the same structures as those in the semiconductor laser device shown in FIG. 1. The second cladding layer 108 shown in FIG. 4 is formed on a light emitting layer 7, and has a flat portion 182 and a projection 181. A recess 183 is formed on the flat portion 182 along both sidewalls of the projection 181. The current blocking layer 112 is formed on an upper surface of the flat portion 182 and on both the saidewalls of the projection 181 of the second cladding layer 108 such that it is embedded in the recess 183 of the second cladding layer 108.

In the semiconductor laser device according to the present embodiment, the recess is filled in with the n-type current blocking layer 112, so that the rise time and the fall time of light output power are shortened, thereby improving response characteristics of light output power.

Figure 5:
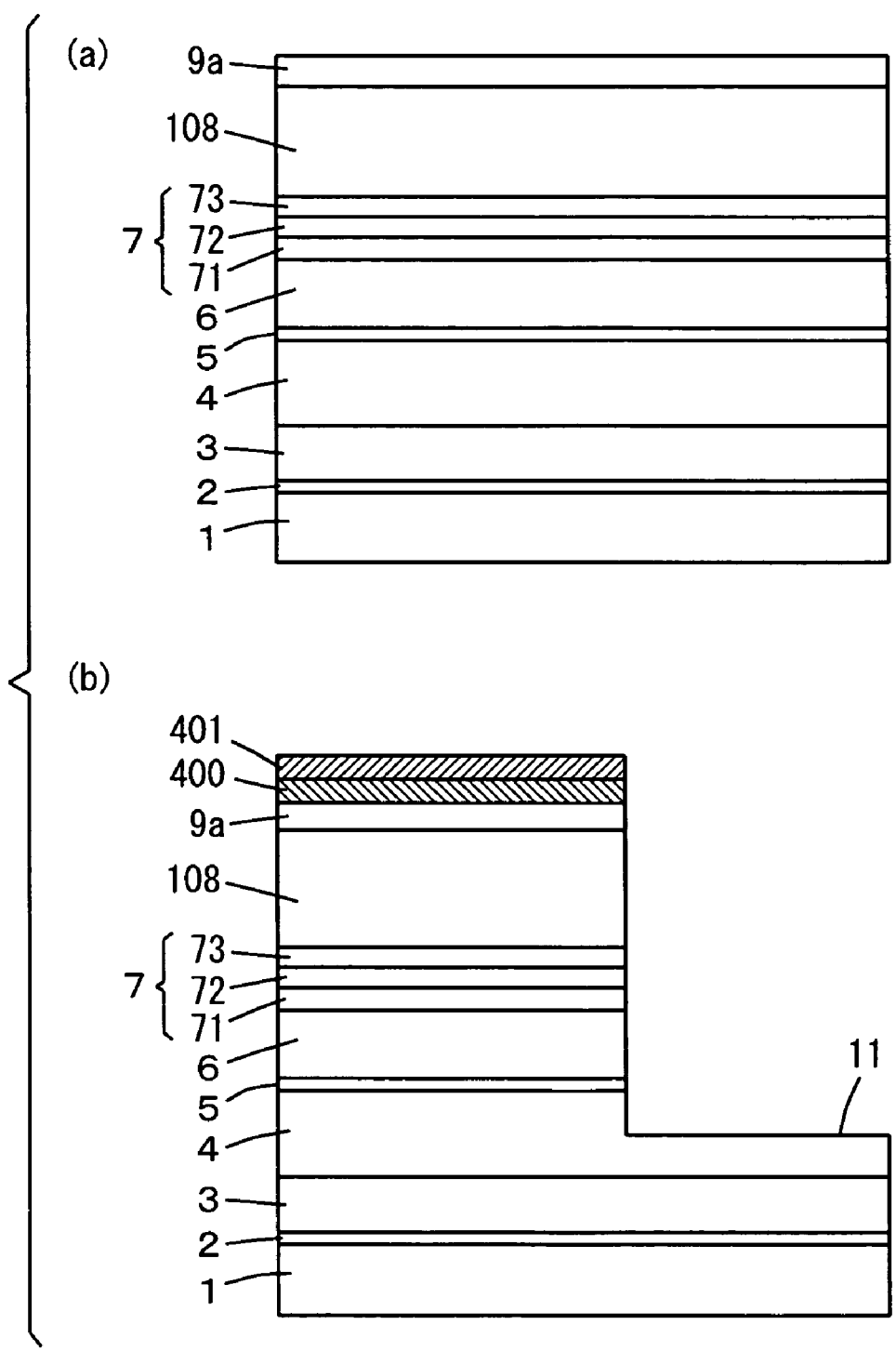
FIG. 5 is a schematic cross-sectional view showing a method of fabricating the semiconductor laser device shown in FIG. 4.
Figure 6:
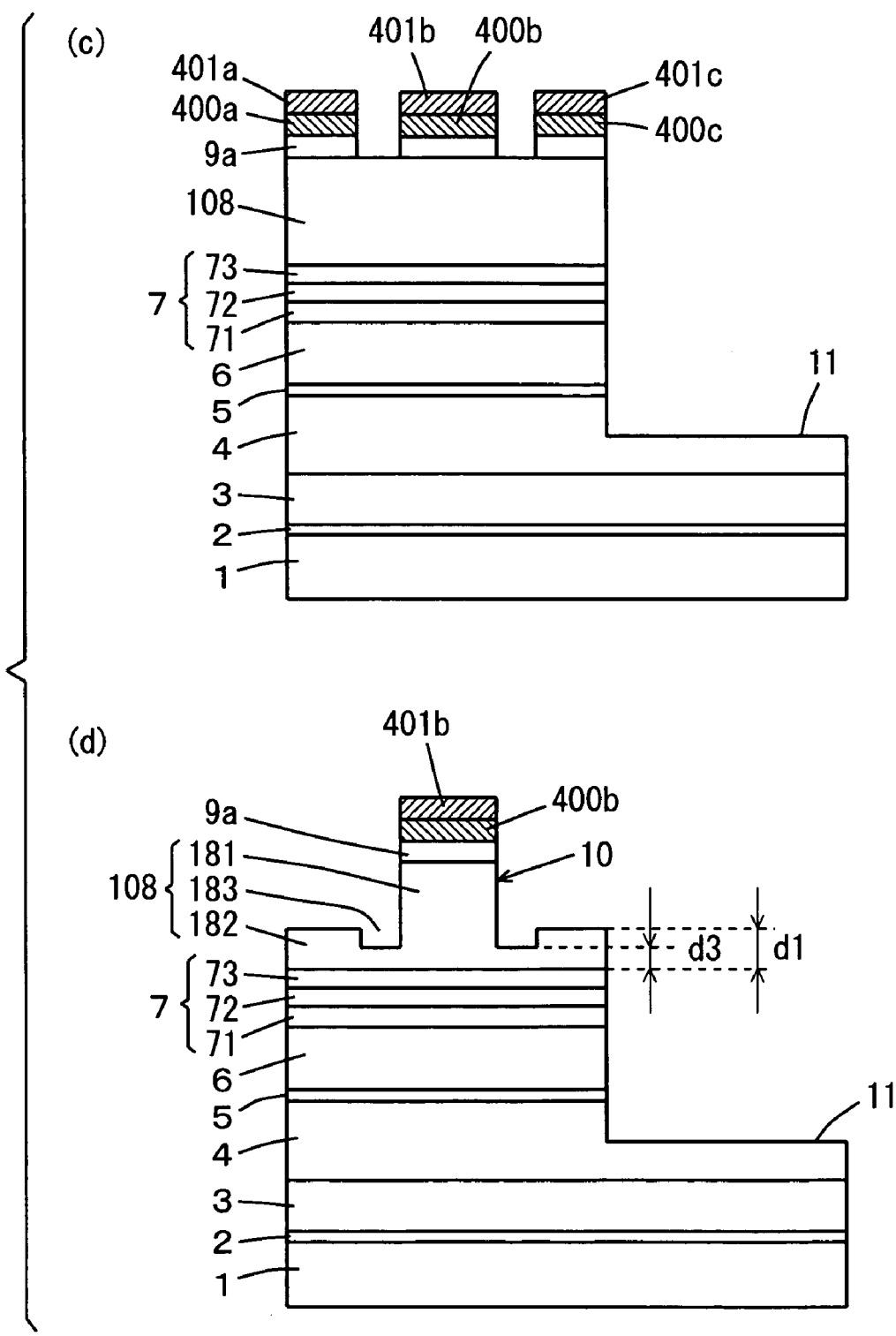
FIG. 6 is a schematic cross-sectional view showing a method of fabricating the semiconductor laser device shown in FIG. 4.
Figure 7:
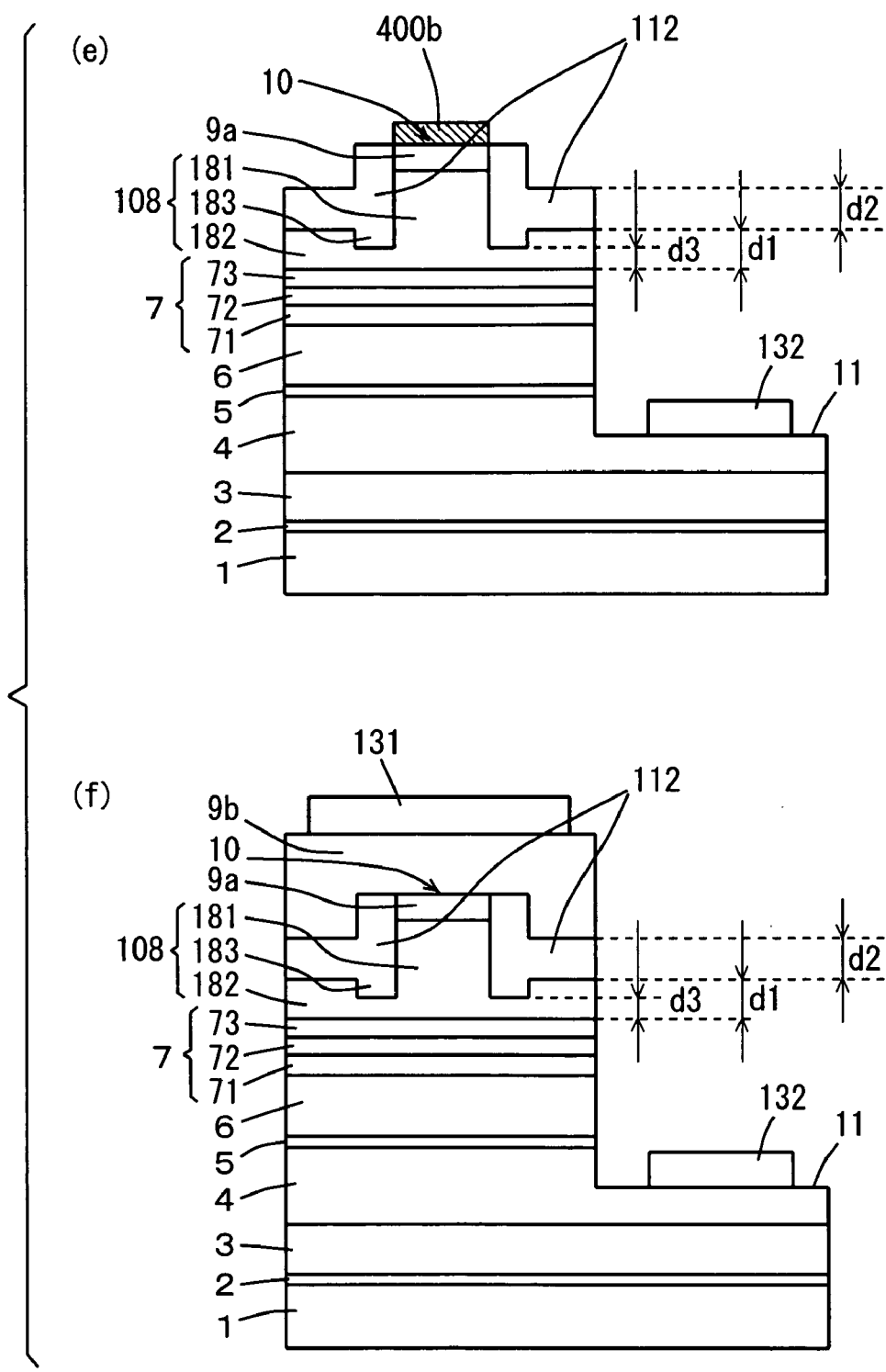
FIG. 7 is a schematic cross-sectional view showing a method of fabricating the semiconductor laser device shown in FIG. 4.

FIGS. 5 to 7 are schematic cross-sectional views showing the steps of fabricating the semiconductor laser device shown in FIG. 4.

As shown in FIG. 5(a), a buffer layer 2 having a thickness of 25 nm composed of undoped $Al_{0.5}Ga_{0.5}N$, an undoped GaN layer 3 having a thickness of 2 μm composed of undoped GaN, a first contact layer 4 having a thickness of 3 μm composed of Si doped n-GaN, a crack preventing layer 5 having a thickness of 0.1 μm composed of Si doped n-$In_{0.1}Ga_{0.9}N$, a first cladding layer 6 having a thickness of 1.5 μm composed of Si doped n-$Al_{0.07}Ga_{0.93}N$, a light emitting layer 7 having a multiquantum well structure, described later, a second cladding layer 108 having a thickness of 1.5 μm composed of Mg doped p-$Al_{0.07}Ga_{0.93}N$, and a second contact layer 9a having a thickness of 0.05 μm composed of Mg doped p-GaN are stacked in this order on a C plane of a sapphire substrate 1 by MOCVD (Metal Organic Chemical Vapor Deposition).

As shown in FIG. 5(b), an $SiO_2$ film 400 and an Ni film 401 are formed in a predetermined region on an upper surface of the second contact layer 9a. A partial region of the n-contact layer 4 is etched to a predetermined depth by RIE or RIBE using the $SiO_2$ film 400 and the Ni film 401 as masks, to form an electrode forming surface 11 for forming an n-side electrode.

As shown in FIG. 6(c), the $SiO_2$ film 400 and the Ni film 401 in a region corresponding to the recess 183 shown in FIG. 4 are removed, to form $SiO_2$ films 400a to 400c and Ni films 410a to 401c. A part of the second contact layer 9a composed of p-GaN is removed by RIBE or RIE using the $SiO_2$ films 400a to 400c and the Ni films 410a to 401c as masks, to form a recess having a width of 1 μm and having a depth of 0.05 μm.

As shown in FIG. 6(d), the $SiO_2$ films 400a and 400c and the Ni films 401a and 401c are removed, leaving the $SiO_2$ film 400b and the Ni film 401b, and are etched to a predetermined depth using the $SiO_2$ film 400b and the Ni film 401b as masks such that the thickness of the flat portion 182 of the p-cladding layer 108 is d1.

As shown in FIG. 7(e), an n-current blocking layer 112 is selectively grown using the SiO$_2$ film 400b as a mask.

Finally, as shown in FIG. 7(f), the third contact layer 9b is grown, to form a p-side electrode 131 and an n-side electrode 132.

In place of the above-mentioned fabricating method, it is also possible to provide the recess 183 along both sidewalls of the ridge portion 10 by forming the ridge portion 10 and then, etching the whole surface of the flat portion 182 of the p-cladding layer 8 utilizing the fact that the etching rate in a portion along both the sidewalls of the ridge portion 10 is high.

Fourth Embodiment

In a semiconductor laser device according to a fourth embodiment, the current blocking layer 112 in the semiconductor laser device shown in FIG. 4 is formed of high-resistive Al$_{0.12}$Ga$_{0.88}$N, to which impurities have been added. Portions excluding a current blocking layer in the semiconductor laser device according to the fourth embodiment have the same structures as those in the semiconductor laser device shown in FIG. 4.

In the semiconductor laser device according to the present embodiment, the current blocking layer composed of Al$_{0.12}$Ga$_{0.88}$N is made high resistive by doping impurities, thereby improving response characteristics of light output power, as in the semiconductor laser device shown in FIG. 1.

It is preferable that the resistance value of the current blocking layer is not less than 1.5 Ω·cm in order to sufficiently improve the response characteristics of light output power.

Fifth Embodiment

Figure 8:
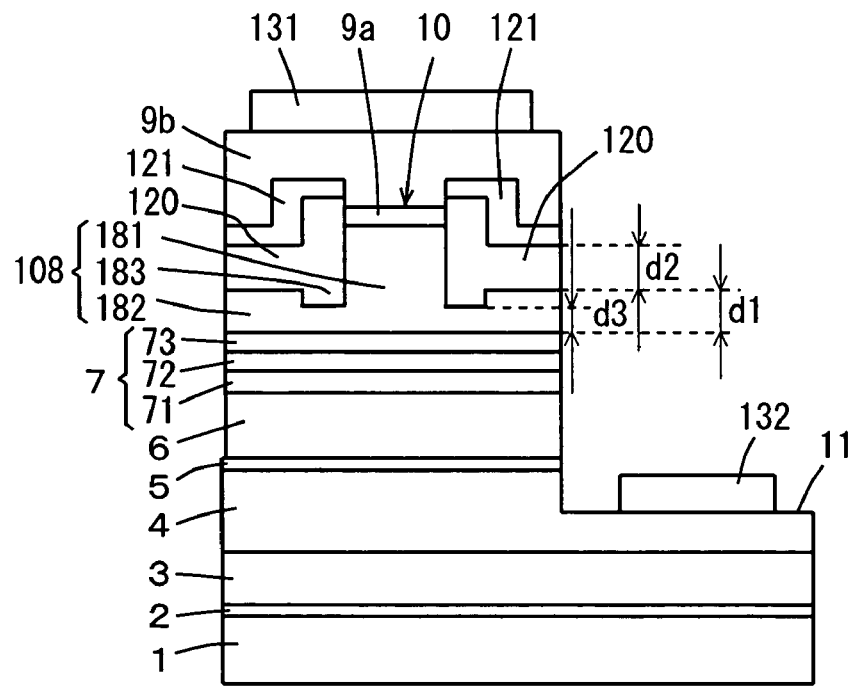
FIG. 8 is a schematic cross-sectional view showing the structure of a semiconductor laser device according to a fifth embodiment of the present invention.

FIG. 8 is a schematic cross-sectional view showing the structure of a semiconductor laser device according to a fifth embodiment of the present invention.

The semiconductor laser device shown in FIG. 8 and the semiconductor laser device shown in FIG. 3 differ in a second cladding layer and a current blocking layer. However, portions other than a second cladding layer 108 and a current blocking layer 120 in the semiconductor laser device shown in FIG. 8 have the same structures as those in the semiconductor laser device shown in FIG. 3. The second cladding layer 108 shown in FIG. 8 is formed on a light emitting layer 7, and has a flat portion 182 and a striped projection 181. A recess 183 is formed on the flat portion 182 along both sidewalls of the striped projection 181. The current blocking layer 120 is formed on an upper surface of the flat portion 182 and on both the sidewalls of the projection 181 of the second cladding layer 108 such that it is embedded in the recess 183 of the second cladding layer 108. The thickness d3 of the second cladding layer 108 in a portion where the recess 183 is formed is smaller than the thickness d1 of the flat portion 182.

In the semiconductor laser device according to the present embodiment, the current blocking layer 120 composed of Al$_{0.12}$Ga$_{0.88}$N is made high resistive by doping impurities, so that response characteristics of light output power are improved, as in the semiconductor laser device shown in FIG. 1. Further, a second current blocking layer 121 of a conductivity type opposite to that of the second cladding layer 108 is provided, thereby reducing an operating current.

The recess 183 is filled in with the current blocking layer 120, thereby further improving the response characteristics of light output power.

Sixth Embodiment

Figure 9:
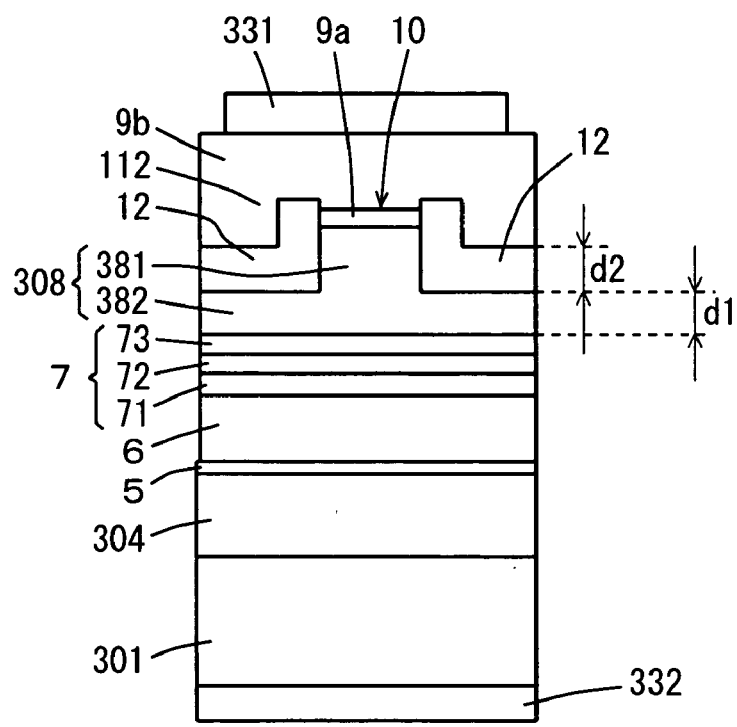
FIG. 9 is a schematic cross-sectional view showing the structure of a semiconductor laser device according to a sixth embodiment of the present invention.

FIG. 9 is a schematic cross-sectional view showing the structure of a semiconductor laser device according to a sixth embodiment of the present invention.

The semiconductor laser device shown in FIG. 9 and the semiconductor laser device shown in FIG. 1 differ in a substrate, layers between the substrate and a crack preventing layer, and a second cladding layer. Other portions have the same structures as those in the semiconductor laser device shown in FIG. 1. That is, the semiconductor laser device shown in FIG. 9 is obtained by stacking, on an n-GaN substrate 301, a buffer layer 304 having a thickness of 3 μm composed of Si doped n-GaN, the same layers 5 to 7 as those in the semiconductor laser device shown in FIG. 1, a second cladding layer 308 having a thickness of 1.5 μm composed of Mg doped p-Al$_{0.07}$Ga$_{0.93}$N, and a second contact layer 9a by MOCVD.

A partial region of the second contact layer 9a and the second cladding layer 308 are removed by RIE or RIBE, leaving a portion having a predetermined thickness d1, to form a striped ridge portion 10. The width of the ridge portion 10 at this time is adjusted between 2.0 to 5.0 μm. The second cladding layer 308 has a flat portion 382 having a thickness of d1 and a projection 381.

A current blocking layer 12 having a thickness of d2 composed of Al$_{0.12}$Ga$_{0.88}$N is formed on both sidewalls of the ridge portion 10 and on the flat portion 382 of the second cladding layer 308. Further, a third contact layer 9b having a thickness of 0.5 μm composed of Mg doped p-GaN is stacked from an upper surface of the second contact layer 9a to an upper surface of the current blocking layer 12.

A p-side electrode 331 is formed on the p-third contact layer 9a, and an n-side electrode 332 is formed on the reverse surface of the n-GaN substrate 301.

Also in the present embodiment, the current blocking layer 12 is made high resistive by doping impurities. Accordingly, the rise time and the fall time of light output power are shortened, thereby improving response characteristics of light output power, as in the semiconductor laser shown in FIG. 1.

Seventh Embodiment

Figure 10:
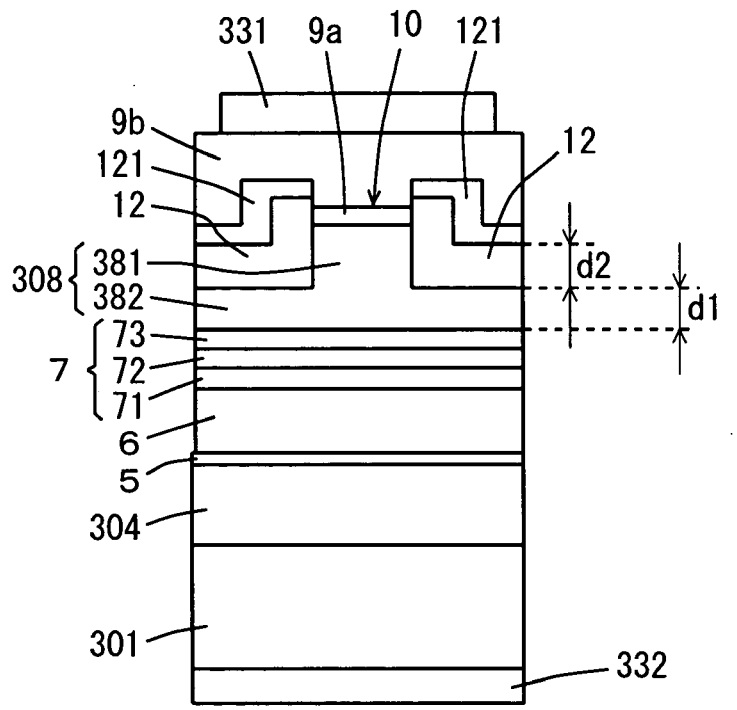
FIG. 10 is a schematic cross-sectional view showing the structure of a semiconductor laser device according to a seventh embodiment of the present invention.

FIG. 10 is a schematic cross-sectional view showing the structure of a semiconductor laser device according to a seventh embodiment of the present invention.

The semiconductor laser device shown in FIG. 10 and the semiconductor laser device shown in FIG. 9 differ in the structure of a current blocking layer. However, portions excluding a second current blocking layer 121 in the semiconductor laser device shown in FIG. 10 have the same structures as those in the semiconductor laser device shown in FIG. 9. That is, in the semiconductor laser device shown in FIG. 10, the second current layer 121 having a thickness of 0.3 μm composed of n-Al$_{0.12}$Ga$_{0.88}$N is formed on a current blocking layer 12 in the semiconductor laser device shown in FIG. 9.

In the semiconductor laser device according to the present embodiment, the current blocking layer 12 composed of Al$_{0.12}$Ga$_{0.88}$N is made high resistive by doping impurities, thereby improving response characteristics of light output power, as in the semiconductor laser device shown in FIG.

1. Further, the second current blocking layer 121 of a conductivity type opposite to that of the second cladding layer 8 is provided, thereby reducing an operating current.

Eighth Embodiment

Figure 11:
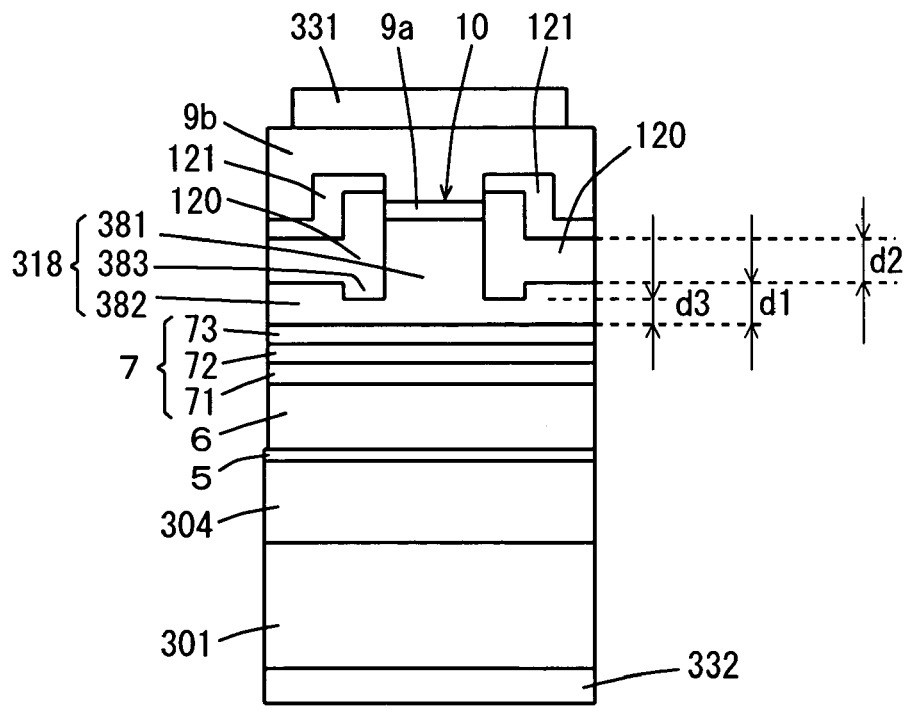
FIG. 11 is a schematic cross-sectional view showing the structure of a semiconductor laser device according to an eighth embodiment of the present invention.

FIG. 11 is a schematic cross-sectional view showing the structure of a semiconductor laser device according to an eighth embodiment of the present invention.

The semiconductor laser device shown in FIG. 11 and the semiconductor laser device shown in FIG. 10 differ in a second cladding layer and a current blocking layer. However, portions excluding a second cladding layer 308 and a current blocking layer 12 in the semiconductor laser device shown in FIG. 10 have the same structures as those in the semiconductor laser device shown in FIG. 10. A second cladding layer 318 shown in FIG. 11 has a flat portion 382 and a striped projection 381. A recess 383 is formed on the flat portion 382 along both sidewalls of the striped projection 381. A current blocking layer 120 is formed on an upper surface of the flat portion 382 and on both the sidewalls of the projection 381 of the second cladding layer 318 such that it is embedded in the recess 383 of the second cladding layer 318.

In the semiconductor laser device according to the present embodiment, the current blocking layer 120 composed of $Al_{0.12}Ga_{0.88}N$ is made high resistive by doping impurities, thereby improving response characteristics of light output power, as in the semiconductor laser device shown in FIG. 1. A second current blocking layer 121 of a conductivity type opposite to that of the second cladding layer 318 is provided, thereby reducing an operating current. The recess 383 is filled in with the current blocking layer 120, thereby further improving the response characteristics of light output power.

It is preferable that the resistance value of the current blocking layer 120 is not less than 1.5 Ω·cm in order to sufficiently improve the response characteristics of light output power.

EXAMPLE

The semiconductor laser device according to the first embodiment shown in FIG. 1, the semiconductor laser device according to the second embodiment shown in FIG. 3, the semiconductor laser device according to the third embodiment shown in FIG. 4, the semiconductor laser device according to the fourth embodiment, the semiconductor laser device according to the fifth embodiment shown in FIG. 8, the semiconductor laser device according to the sixth embodiment shown in FIG. 9, the semiconductor laser device according to the seventh embodiment shown in FIG. 10, the semiconductor laser device according to the eighth embodiment shown in FIG. 11, and a semiconductor laser device in the comparative example were fabricated, to measure the characteristics thereof.

In the semiconductor laser devices according to the first embodiment shown in FIG. 1, the second embodiment shown in FIG. 3, the sixth embodiment shown in FIG. 9, and the seventh embodiment shown in FIG. 10, the width of the ridge portion 10 was set to 3 μm, the thickness d2 of the current blocking layer 12 was set to 0.5 μm, and Zn (zinc) was doped as impurities into the current blocking layer 12. In the semiconductor laser device according to the third embodiment shown in FIG. 4, the width of the ridge portion 10 was set to 3 μm, the thickness d2 of the current blocking layer 112 was set to 0.5 μm, and Si was doped as impurities into the current blocking layer 112. In the semiconductor laser device according to the fifth embodiment shown in FIG. 8 and the semiconductor laser device according to the eighth embodiment shown in FIG. 11, the width of the ridge portion 10 was set to 3 μm, the thickness d2 of the current blocking layer 120 was set to 0.5 μm, and Zn was doped as impurities into the current blocking layer 120. The depths of the recesses 183 and 383 (i.e., d1 minus d3) were set to 0.05 μm.

The semiconductor laser device according to the fourth embodiment has the same structure as the semiconductor laser device according to the third embodiment shown in FIG. 4 except that Zn is doped as impurities into the current blocking layer. The semiconductor laser device in the comparative example has the same structure as the semiconductor laser device according to the first embodiment shown in FIG. 1 except that only Si is doped into the current blocking layer, to make the current blocking layer into an n-type one.

Figure 12:
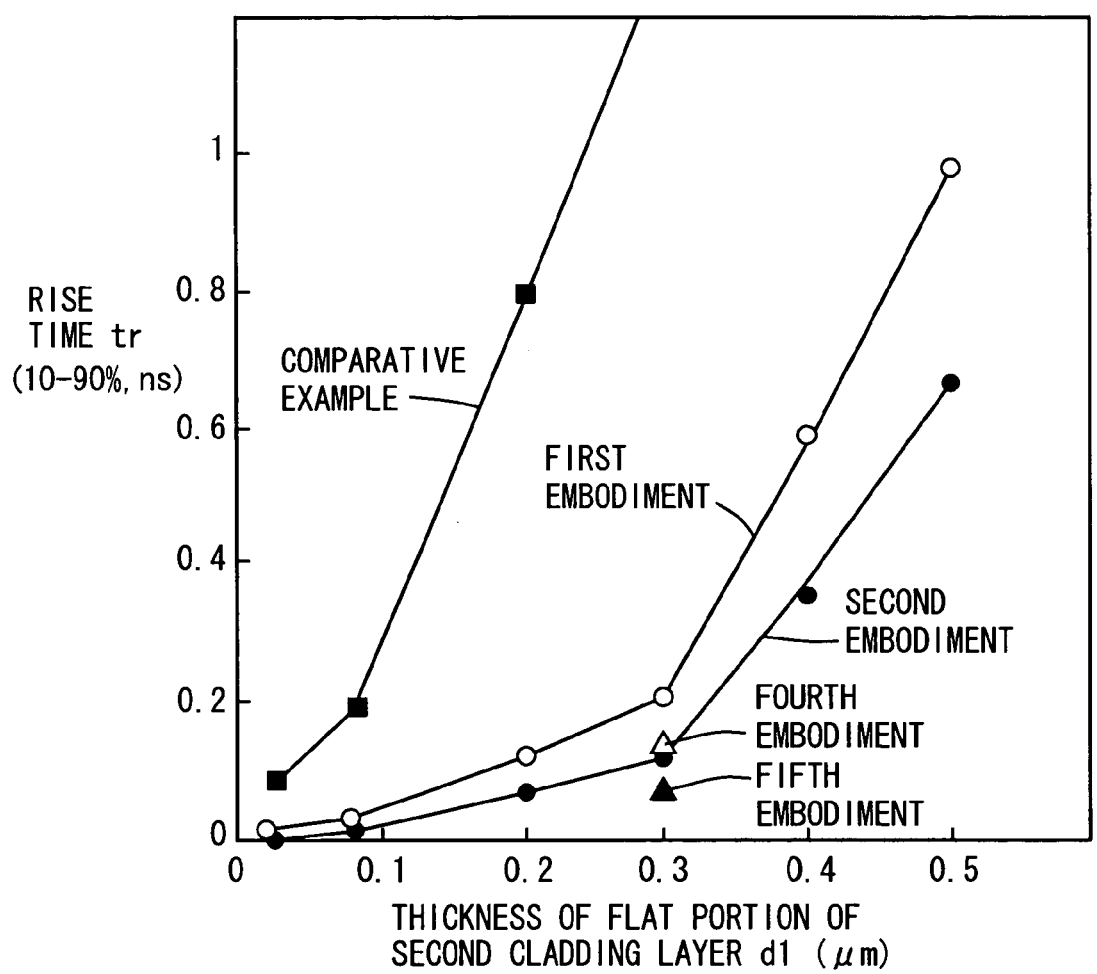
FIG. 12 is a diagram showing the results of measurement of dependence of the rise time of light output power on the thickness of a flat portion of a second cladding layer in each of the semiconductor laser devices in the first, second, fourth, and fifth embodiments and a semiconductor laser device in a comparative example.
Figure 13:
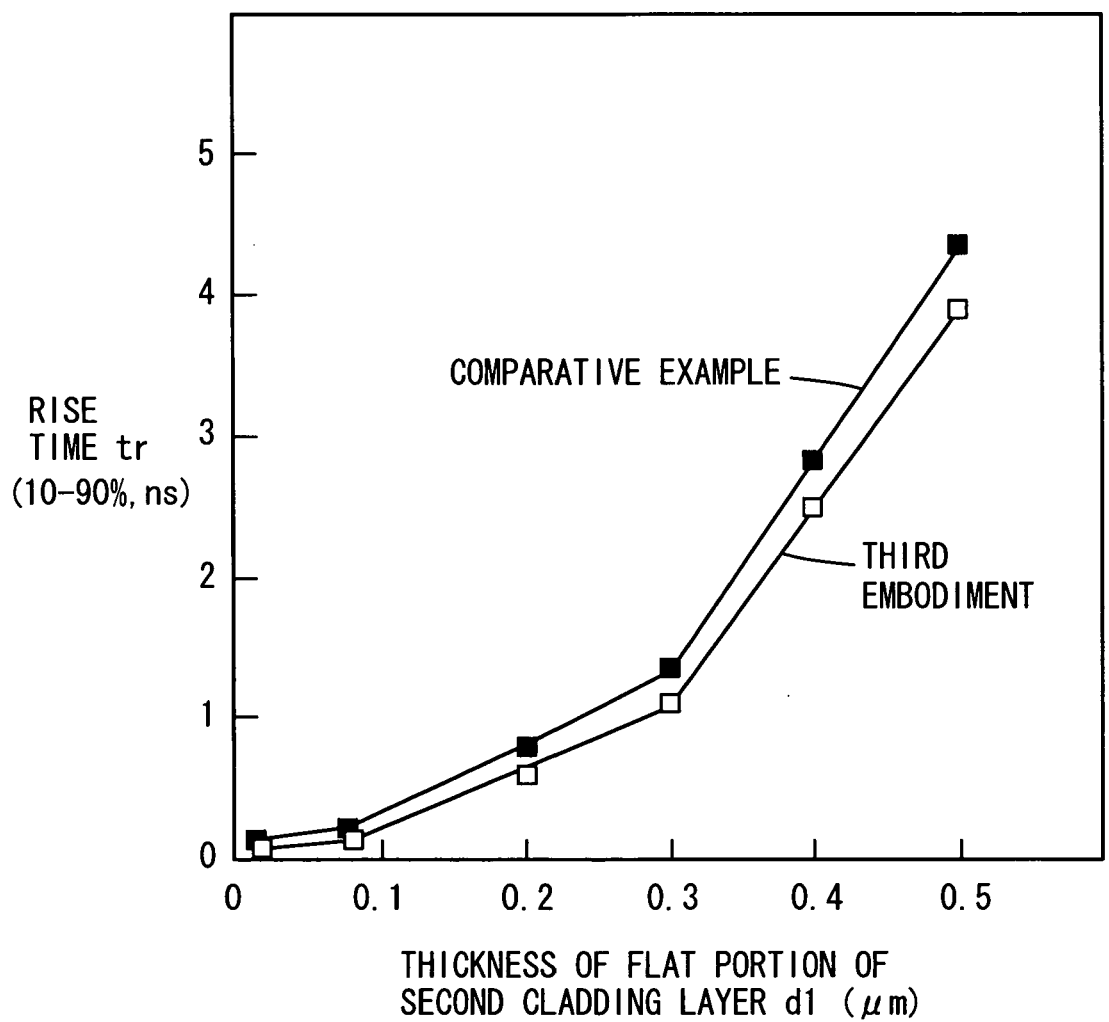
FIG. 13 is a diagram showing the results of measurement of dependence of the rise time of light output power on the thickness of a flat potion of a second cladding layer in each of the semiconductor laser devices in the third embodiment and the comparative example.
Figure 14:
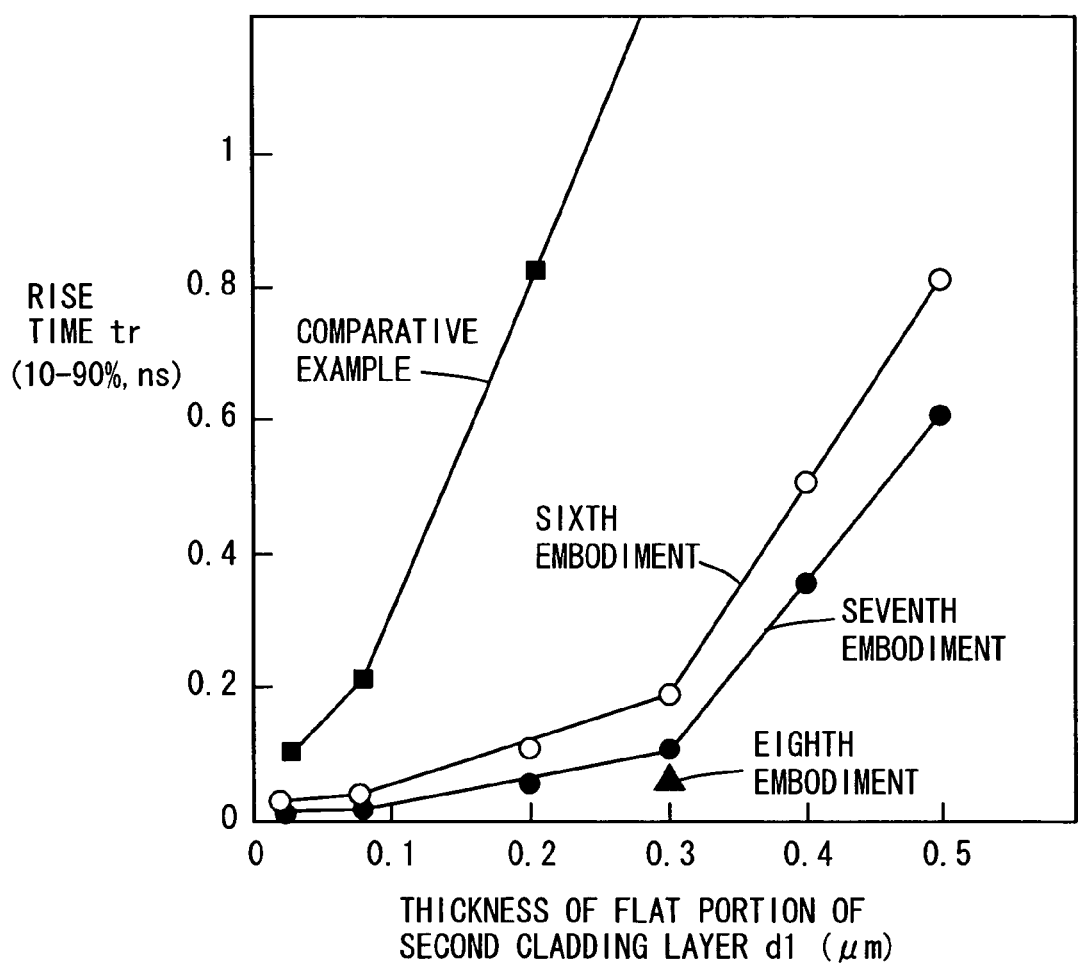
FIG. 14 is a diagram showing the results of measurement of dependence of the rise time of light output power on the thickness of a flat portion of a second cladding layer in the semiconductor laser devices in each of the sixth to eighth embodiments and the comparative example.

The relationship between the rise time tr and the thickness d1 of the flat portion of the second cladding layer in each of the semiconductor laser devices according to the first to eighth embodiments and the semiconductor laser device in the comparative example were measured. The results of the measurement are shown in FIGS. 12, 13, and 14. The results of the measurement with respect to the semiconductor laser devices according to the first to third embodiments, the sixth embodiment, and the seventh embodiment are shown in Table 1. With respect to the semiconductor laser devices according to the fourth, fifth and eighth embodiments, measurements in a case where the thickness d1 of the flat portion of the second cladding layer is 0.3 μm were made. The rise time tr in each of the semiconductor laser devices according to the fourth, fifth, and eighth embodiments were respectively 0.13 ns, 0.08 ns, and 0.06 ns.

The rise time tr of light output power was defined as a time period elapsed from the time point where light output power reaches 10% of a peak power of 5 mW until it reaches 90% thereof. The measurements were made under pulsed operations such as a pulse width of 50 ns and a duty cycle of 50% (a repetition rate of 10 MHz).

TABLE 1

| thickness of flat portion of second cladding layer d1(μm) | 0.02 | 0.08 | 0.2 | 0.3 | 0.4 | 0.5 |
|---|---|---|---|---|---|---|
| rise time tr(ns) (first embodiment) | 0.01 | 0.03 | 0.12 | 0.2 | 0.59 | 0.98 |
| rise time tr(ns) (second embodiment) | 0.01 | 0.01 | 0.06 | 0.12 | 0.35 | 0.66 |
| rise time tr(ns) (third embodiment) | 0.06 | 0.14 | 0.62 | 1.1 | 2.5 | 3.9 |
| rise time tr(ns) (sixth embodiment) | 0.01 | 0.03 | 0.10 | 0.18 | 0.50 | 0.80 |
| rise time tr(ns) (seventh embodiment) | 0.01 | 0.01 | 0.05 | 0.10 | 0.35 | 0.60 |
| rise time tr(ns) (comparative example) | 0.08 | 0.20 | 0.8 | 1.4 | 2.8 | 4.4 |

The rise time tr in each of the semiconductor laser devices according to the first to eighth embodiments is always shorter than the rise time tr in the semiconductor laser device in the comparative example irrespective of the thickness d1 of the flat portion of the second cladding layer.

In the semiconductor laser devices according to the first to third, sixth and seventh embodiments, the rise time tr of light output power decreases as the thickness d1 of the flat portion of the second cladding layer decreases. In the semiconductor laser devices according to the first to third, sixth and seventh embodiments, when the thickness d1 of the flat portion of the second cladding layer is not less than 0.3 μm, the rise time tr rapidly increases as the thickness d1 of the flat portion of the second cladding layer increases. The increase in the rise time tr becomes gentle at the time point where the thickness d1 of the flat portion of the second cladding layer is not more than 0.3 μm, and becomes gentler at the time point where it is not more than 0.08 μm. In order to stably ensure the short rise time tr, therefore, the thickness d1 of the flat portion of the second cladding layer is preferably not more than 0.3 μm, and more preferably not more than 0.08 μm.

At the time point where the thickness d1 of the flat portion of the second cladding layer is 0.3 μm, the rise times tr in the semiconductor laser devices according to the first to eighth embodiments are compared. The comparison shows that the rise times tr in the semiconductor laser devices according to the first and sixth embodiments are shorter than the rise time tr in the semiconductor laser device according to the third embodiment, the rise times tr in the semiconductor laser devices according to the second, fourth and seventh embodiments are shorter than the rise times tr in the semiconductor laser devices according to the first and sixth embodiments, and the rise times tr in the semiconductor laser devices according to the fifth and eighth embodiments are shorter than the rise times tr in the semiconductor laser devices in the second, fourth and seventh embodiments.

This indicates that it is possible to add the effect of making the current blocking layer high resistive by adding impurities, the effect of forming the second current blocking layer 121 to shorten the rise time tr, and the effect of filling in the recess of the second cladding layer with the current blocking layer to shorten the rise time tr.

Figure 15:
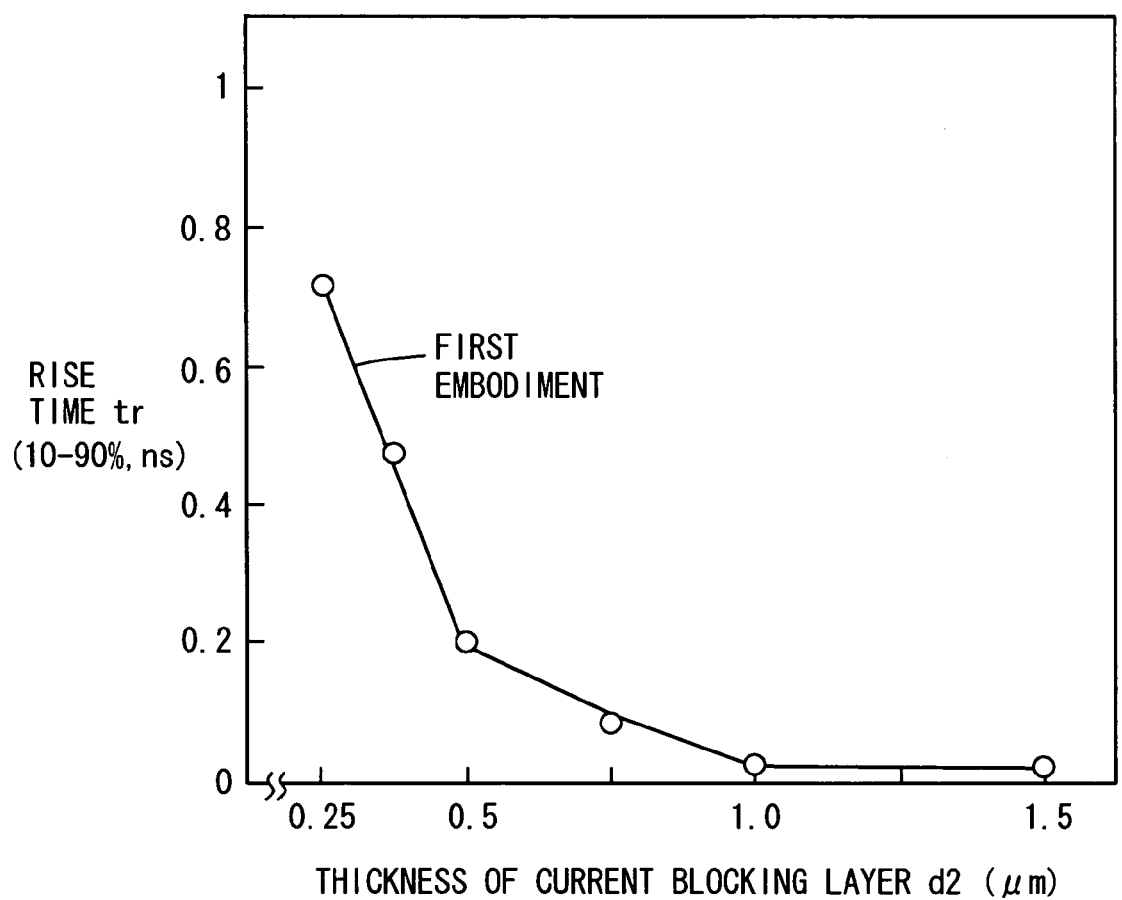
FIG. 15 is a diagram showing the results of measurement of dependence of the rise time of light output power on the thickness of a current blocking layer in the semiconductor laser device according to the first embodiment.
Figure 17:
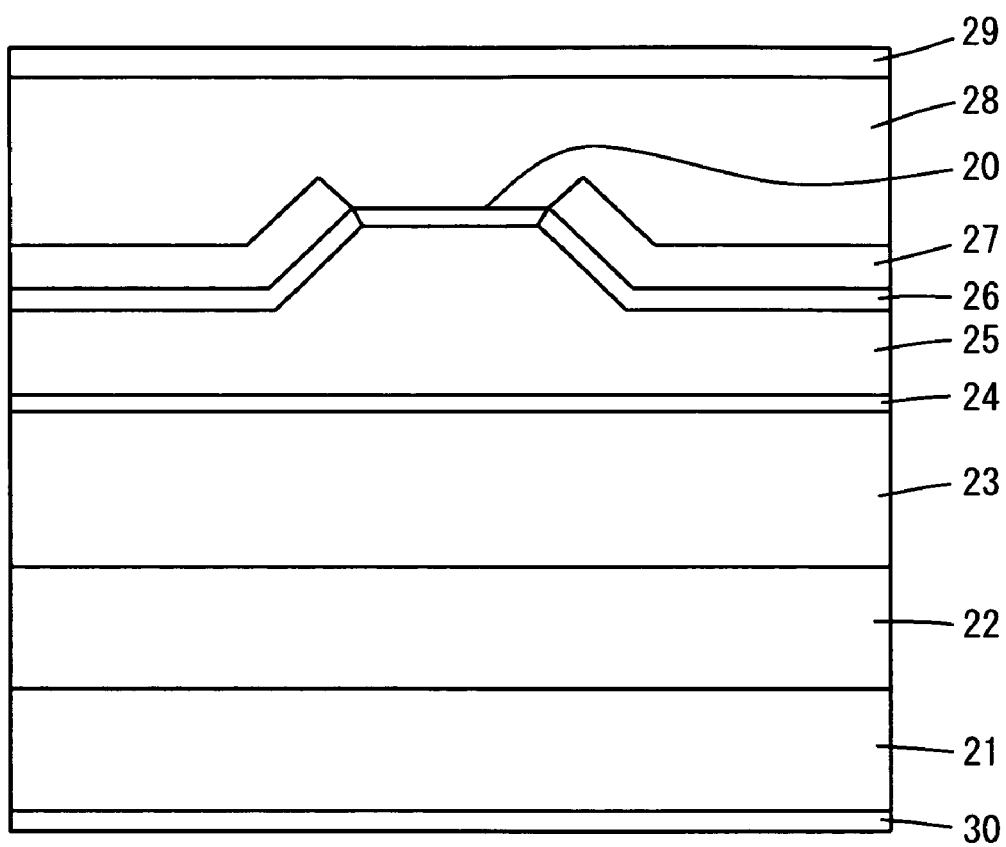
FIG. 17 is a schematic cross-sectional view showing the structure of a conventional semiconductor laser device.

With respect to the semiconductor laser device according to the first embodiment shown in FIG. 1, the relationship between the thickness d2 of the current blocking layer and the rise time tr was measured. The results of the measurement are shown in FIG. 15 and Table 2.

TABLE 2

| thickness of current blocking layer d2(μm) | 0.25 | 0.37 | 0.5 | 0.75 | 1.0 | 1.5 |
|---|---|---|---|---|---|---|
| rise time tr(ns) | 0.71 | 0.47 | 0.2 | 0.08 | 0.02 | 0.01 |

The thickness d1 of the flat portion 82 of the second cladding layer 8 was set to 0.3 μm. From the results of the measurements, it is found that the rise time tr decreases as the thickness d2 of the current blocking layer 12 increases. In a region where the thickness d2 of the current blocking layer 12 is not more than 0.5 μm, the rise time tr rapidly increases as the thickness d2 decreases. On the other hand, in a region where the thickness d2 of the current blocking layer 12 is not less than 1.0 μm, the rise time tr hardly decreases. In order to stably ensure the short rise time tr, therefore, the thickness d2 of the current blocking layer 12 is preferably not less than 0.5 μm, and more preferably not less than 1.0 μm.

The relationship between the thickness d1 of the flat portion of the second cladding layer and the operating current was measured with respect to the semiconductor laser devices according to the first and second embodiments. The results of the measurement are shown in FIG. 16 and Table 3.

TABLE 3

| thickness of flat portion of second cladding layer d1(μm) | 0.02 | 0.08 | 0.2 | 0.3 | 0.4 | 0.5 |
|---|---|---|---|---|---|---|
| operating current (mA) (first embodiment) | 72 | 74 | 77 | 79 | 81 | 83 |
| operating current (mA) (second embodiment) | 69 | 71 | 73 | 74 | 76 | 78 |

The results show that the operating current in the semiconductor laser device according to the second embodiment shown in FIG. 3 is smaller than the operating current in the semiconductor laser device according to the first embodiment shown in FIG. 1 by 3 to 5 mA.

The foregoing and other objects, features, aspects and advantages of the present invention will become more apparent from the following detailed description of the present invention when taken in conjunction with the accompanying drawings.

What is claimed is:

1. A semiconductor light emitting device comprising:
    an active layer composed of a nitride based semiconductor;
    a cladding layer formed on said active layer, composed of a nitride based semiconductor of a first conductivity type, and having a flat portion and a ridge portion formed on the flat portion;
    a first current blocking layer formed on said flat portion and on sidewalls of said ridge portion of said cladding layer and composed of a high-resistive nitride based semiconductor containing impurities; and
    a second current blocking layer formed on and above said first current blocking layer and composed of a nitride based semiconductor of a second conductivity type opposite to said first conductivity type;
    wherein the cladding layer is composed of AlGaN;
    wherein the first current blocking layer is composed of AlGaN having a larger composition ratio than that of the cladding layer;
    wherein said impurities contain at least one of zinc, beryllium, calcium, and carbon;
    wherein said first current blocking layer has a resistance value of not less than 1.5 Ωcm.

2. The semiconductor light emitting device according to claim 1, wherein the thickness of said first current blocking layer is not less than 0.5 μm.

3. The semiconductor light emitting device according to claim 2, wherein the thickness of said first current blocking layer is not less than 1.0 μm.

4. The semiconductor light emitting device according to claim 1, wherein the thickness of the flat portion of said cladding layer is not more than 0.3 μm.

5. The semiconductor light emitting device according to claim 4, wherein the thickness of the flat portion of said cladding layer is not more than 0.08 μm.

6. The semiconductor light emitting device according to claim 1, wherein said nitride based semiconductor contains at least one of boron, gallium, aluminum, indium, and thallium.

7. The semiconductor light emitting device according to claim 1, wherein
    said cladding layer having a recess on said flat portion along both sidewalls of said ridge portion; and
    said first current blocking layer is formed on said flat portion and on the sidewalls of said ridge portion such that it is embedded in said recess of said cladding layer.

* * * * *